(12) United States Patent
Liu et al.

(10) Patent No.: US 9,281,183 B2
(45) Date of Patent: Mar. 8, 2016

(54) METALORGANIC CHEMICAL VAPOR DEPOSITION OF OXIDE DIELECTRICS ON N-POLAR III-NITRIDE SEMICONDUCTORS WITH HIGH INTERFACE QUALITY AND TUNABLE FIXED INTERFACE CHARGE

(71) Applicant: THE REGENTS OF THE UNIVERSITY OF CALIFORNIA, Oakland, CA (US)

(72) Inventors: Xiang Liu, Goleta, CA (US); Umesh K. Mishra, Montecito, CA (US); Stacia Keller, Santa Barbara, CA (US); Jeonghee Kim, Goleta, CA (US); Matthew Laurent, Santa Barbara, CA (US); Jing Lu, Goleta, CA (US); Ramya Yeluri, Santa Barbara, CA (US); Silvia H. Chan, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 14/597,989

(22) Filed: Jan. 15, 2015

(65) Prior Publication Data

US 2015/0200286 A1    Jul. 16, 2015

Related U.S. Application Data

(60) Provisional application No. 61/927,807, filed on Jan. 15, 2014.

(51) Int. Cl.
| | |
|---|---|
| *H01L 21/00* | (2006.01) |
| *H01L 29/00* | (2006.01) |
| *H01L 21/02* | (2006.01) |
| *H01L 29/66* | (2006.01) |
| *H01L 29/778* | (2006.01) |

(Continued)

(52) U.S. Cl.
CPC .......... *H01L 21/02271* (2013.01); *C30B 25/02* (2013.01); *H01L 21/0254* (2013.01); *H01L 21/0257* (2013.01); *H01L 21/0262* (2013.01); *H01L 21/02178* (2013.01); *H01L 29/66462* (2013.01); *H01L 29/7781* (2013.01); *H01L 29/2003* (2013.01)

(58) Field of Classification Search
CPC .................... H01L 29/7786; H01L 29/66462; H01L 21/02178; H01L 21/02271; H01L 21/0254; H01L 21/02647; H01L 21/0262; H01L 21/0257; H01L 29/7781; H01L 29/2003; C30B 25/02
See application file for complete search history.

(56) References Cited

U.S. PATENT DOCUMENTS

| | | | | |
|---|---|---|---|---|
| 7,948,011 | B2 * | 5/2011 | Rajan et al. | 257/194 |
| 8,624,667 | B2 * | 1/2014 | Teo et al. | 327/566 |
| 2008/0199993 | A1 | 8/2008 | Heying et al. | |

(Continued)

OTHER PUBLICATIONS

Liu, X., et al., "In situ metalorganic chemical vapor deposition of Al2O3 on N-face GaN and evidence of polarity induced fixed charge", Applied Physics Letters, 2014, pp. 263511-1-263511-4, vol. 104.

(Continued)

*Primary Examiner* — Nikolay Yushin
(74) *Attorney, Agent, or Firm* — Gates & Cooper LLP

(57) ABSTRACT

A method of fabricating a III-nitride semiconductor device, including growing an III-nitride semiconductor and an oxide sequentially to form an oxide/III-nitride interface, without exposure to air in between growth of the oxide and growth of the III-nitride semiconductor.

17 Claims, 6 Drawing Sheets

(51) Int. Cl.
*C30B 25/02* (2006.01)
*H01L 29/20* (2006.01)

(56) References Cited

U.S. PATENT DOCUMENTS

2010/0117118 A1* 5/2010 Dabiran et al. ............... 257/190
2012/0319127 A1* 12/2012 Chowdhury et al. ........... 257/76
2013/0141156 A1* 6/2013 Teo et al. ...................... 327/530
2014/0158976 A1* 6/2014 Dasgupta et al. ............... 257/12

OTHER PUBLICATIONS

Liu, X., et al., "Metalorganic chemical vapor deposition of Al2O3 using trimethylaluminum and O2 precursors: Growth mechanism and crystallinity", Journal of Crystal Growth, 2014, pp. 78-84, vol. 408.

Mazumder, B., et al., "Atom probe tomography studies of Al2O3 gate dielectrics on GaN", Journal of Applied Physics, 2014, pp. 134101-1-134101-8, vol. 116.

Liu, X., et al., "Fixed charge and trap states of in situ Al2O3 on Ga-face GaN metal-oxide-semiconductor capacitors grown by metalorganic chemical vapor deposition", Journal of Applied Physics, 2013, pp. 164507-1-164507-6, vol. 114.

Liu, X., et al., "In-situ metalorganic chemical vapor deposition and capacitance-voltage characterizations of Al2O3 on Ga-face GaN metal-oxide-semiconductor capacitors", Applied Physics Letters, 2013, pp. 053509-1-053509-5, vol. 103.

Smith, F.W., et al., "Reaction of oxygen with Si(111) and (100): Critical conditions for the growth of SiO2", J. Electrochem. Soc.: Solid State Science and Technology, Jun. 1982, pp. 1300-1306, vol. 129, No. 6.

Yeluri, R., et al., "Dielectric stress tests and capacitance-voltage analysis to evaluate the effect of post deposition annealing on Al2O3 films deposited on GaN", Applied Physics Letters, 2014, pp. 222905-1-222905-4, vol. 105.

Hung, T.H., et al., "Interface charge engineering at atomic layer deposited dielectric/III-nitride interfaces", Applied Physics Letters, 2013, pp. 072105-1-072105-4, vol. 102.

Kao, C.J., et al., "Comparison of low-temperature GaN, SiO2, and SiNx as gate insulators on AlGaN/GaN heterostructure field-effect transistors", Journal of Applied Physics, 2005, pp. 064506-1-064506-5, vol. 98.

Derluyn, J., et al., "Improvement of AlGaN/GaN high electron mobility transistor structure by in situ deposition of a Si3N4 surface layer", Journal of Applied Physics, 2005, pp. 054501-1-054501-5, vol. 98.

Cheng, C.W., et al., "The effect of interface processing on the distribution of interfacial defect states and the C-V characteristics of III-V metal-oxide-semiconductor field effect transistors", Journal of Applied Physics, 2011, pp. 023714-1-023714-8, vol. 109.

Heying, B., et al., "In situ SiN passivation of AlGaN/GaN HEMTs by molecular bema epitaxy", Electronics Letters, Jul. 5, 2007, pp. 779-780, vol. 43, No. 14.

Chang, Y.C., et al., "Effective reduction of interfacial traps in Al2O3/GaAs (001) gate stacks using surface engineering and thermal annealing", Applied Physics Letters, 2011, pp. 112901-1-112901-3, vol. 97.

* cited by examiner

METALORGANIC CHEMICAL VAPOR DEPOSITION OF OXIDE DIELECTRICS ON N-POLAR III-NITRIDE SEMICONDUCTORS WITH HIGH INTERFACE QUALITY AND TUNABLE FIXED INTERFACE CHARGE

CROSS REFERENCE TO RELATED APPLICATIONS

This application claims the benefit under 35 U.S.C Section 119(e) of U.S. Provisional Patent Application Ser. No. 61/927,807 filed on Jan. 15, 2014, by Xiang Liu, Umesh K. Mishra, Stacia Keller, Jeonghee Kim, Matthew Laurent, Jing Lu, Ramya Yeluri, and Silvia H. Chan, entitled "METALORGANIC CHEMICAL VAPOR DEPOSITION OF OXIDE DIELECTRICS ON N-POLAR III-NITRIDE SEMICONDUCTORS WITH HIGH INTERFACE QUALITY AND TUNABLE FIXED INTERFACE CHARGE,", which application is incorporated by reference herein.

STATEMENT REGARDING FEDERALLY SPONSORED RESEARCH AND DEVELOPMENT

This invention was made with Government support under Grant No. FY 2010 Multidisciplinary University Research Initiative (MURI), Topic 7, awarded by the Office of Naval Research (ONR) under the Dielectric Enhancements of Innovative Electronics program (orbit Grant No. N00014-10-1-0937). The Government has certain rights in this invention.

BACKGROUND OF THE INVENTION

1. Field of the Invention

This invention relates to method of fabricating oxide/III-nitride interfaces.

2. Description of the Related Art (Note: This application references a number of different publications as indicated throughout the specification by one or more reference numbers within brackets, e.g., Ref. [x]. A list of these different publications ordered according to these reference numbers can be found below in the section entitled "References." Each of these publications is incorporated by reference herein.)

There is a need for improved methods for the growth of high quality oxides and oxide/semiconductor interfaces for device applications. In existing approaches, semiconductors are usually grown in one chamber and then transferred to another chamber for growth of one or more oxides. During the transfer stage, the semiconductors are usually exposed to ambient air, and common ambient air species, such as C, Si, as well as moisture, can build up on one or more surfaces of the semiconductors, resulting in contamination and formation of a native oxide layer. In order to remove these contaminants and native oxide layers, extensive chemical pretreatments are needed, which increases the total processing time and may have undesired side effects that can compromise interface quality. For example, the semiconductor surface structure may be altered, and additional contaminants may be introduced.

SUMMARY OF THE INVENTION

A method of fabricating a III-nitride semiconductor device, including growing a III-nitride semiconductor and oxide sequentially to form an oxide/III-nitride interface, without exposure to air in between growth of the oxide and growth of the III-nitride semiconductor.

For example, the present invention describes a novel metalorganic chemical vapor deposition (MOCVD) in situ growth approach to produce high quality oxides and oxide/semiconductor interfaces for device applications. In this embodiment, the top oxide layers and the underlying semiconductor layers are grown in the same MOCVD reactor chamber sequentially without breaking the vacuum, e.g., so that no chemical pretreatments are needed on the as-grown semiconductors and the oxide/semiconductor interface is free from ambient air contaminants and is of high quality.

As a result, the use of the in situ growth technique produces high quality oxides and oxide/semiconductor interfaces for device applications.

Thus, one or more embodiments of the present invention disclose a method of fabricating a III-nitride semiconductor, comprising forming (e.g., growing) a III-nitride semiconductor layer (e.g., N-polar III-nitride and/or including an active region of a device); and depositing (e.g., growing) an oxide (e.g., Aluminum Oxide ($Al_2O_3$)) on the III-nitride semiconductor layer, e.g., sequentially to form an oxide/III-nitride interface without exposure to air in between growth of the oxide and growth of the III-nitride semiconductor. The oxide can be deposited on an N-face of the III-nitride semiconductor layer. The growing of the oxide and the III-nitride semiconductor layer can be performed in situ in a growth reactor. The oxide and the III-nitride semiconductor can be grown in separate interconnected chambers in a growth reactor.

The oxide and III-nitride semiconductor can be grown at a temperature above 500 degrees centigrade (° C.), at a temperature above 900° C., e.g., at a temperature in a range of 900° C.-1100° C.

A density of active trap states at the oxide/III-nitride interface can be less than $10^{11}$ cm$^{-2}$. Fixed interface charge at the interface can be negative or negative. The fixed interface charge at the interface can be greater than $-2.5 \times 10^{12}$ cm$^{-2}$ (e.g., in a range of $-2.5 \times 10^{12}$ cm$^{-2}$ to $+8.9 \times 10^{10}$ cm$^{-2}$), where cm is centimeters.

The method can further comprise forming contacts (e.g., source, drain, gate), e.g. to form a device such as a metal oxide semiconductor high electron mobility transistor (MOSHEMT). For example, the oxide can be between a gate of the device and the active region.

One or more embodiments of the invention further disclose a device, comprising an N-polar III-nitride semiconductor active region (e.g., including an N-polar AlGaN barrier layer and an N-polar GaN channel layer); an oxide layer (e.g., $Al_2O_3$) forming an interface with the active region (e.g., with the N-polar GaN channel layer); drain and source contacts electrically coupled to the active region; and a gate deposited on the oxide layer between the source and drain contacts; wherein a density of active trap states at the interface is less than $10^{11}$ cm$^{-2}$.

BRIEF DESCRIPTION OF THE DRAWINGS

Referring now to the drawings in which like reference numbers represent corresponding parts throughout.

Figure 3:
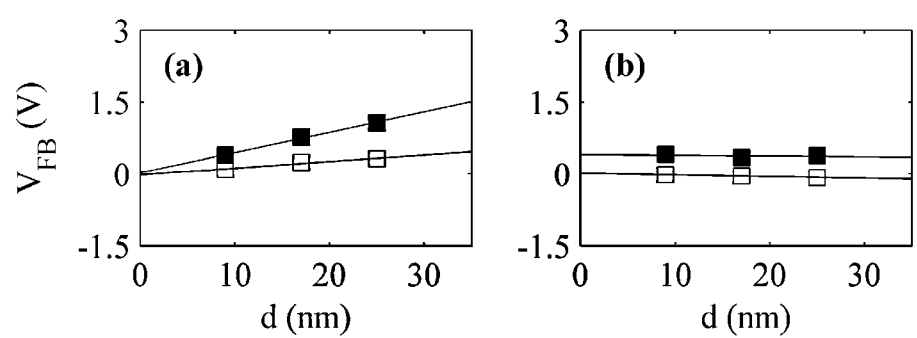

FIG. 3 shows measured flat band voltage $V_{FB}$ (solid square) and hysteresis $\Delta V_{FB}$ (open square) versus oxide film thickness d and the corresponding linear fits using Eq. (1) and (2) for MOSCAPs with $Al_2O_3$ grown at (a) 900° C. and (b) 1000° C., respectively.

Figure 4:
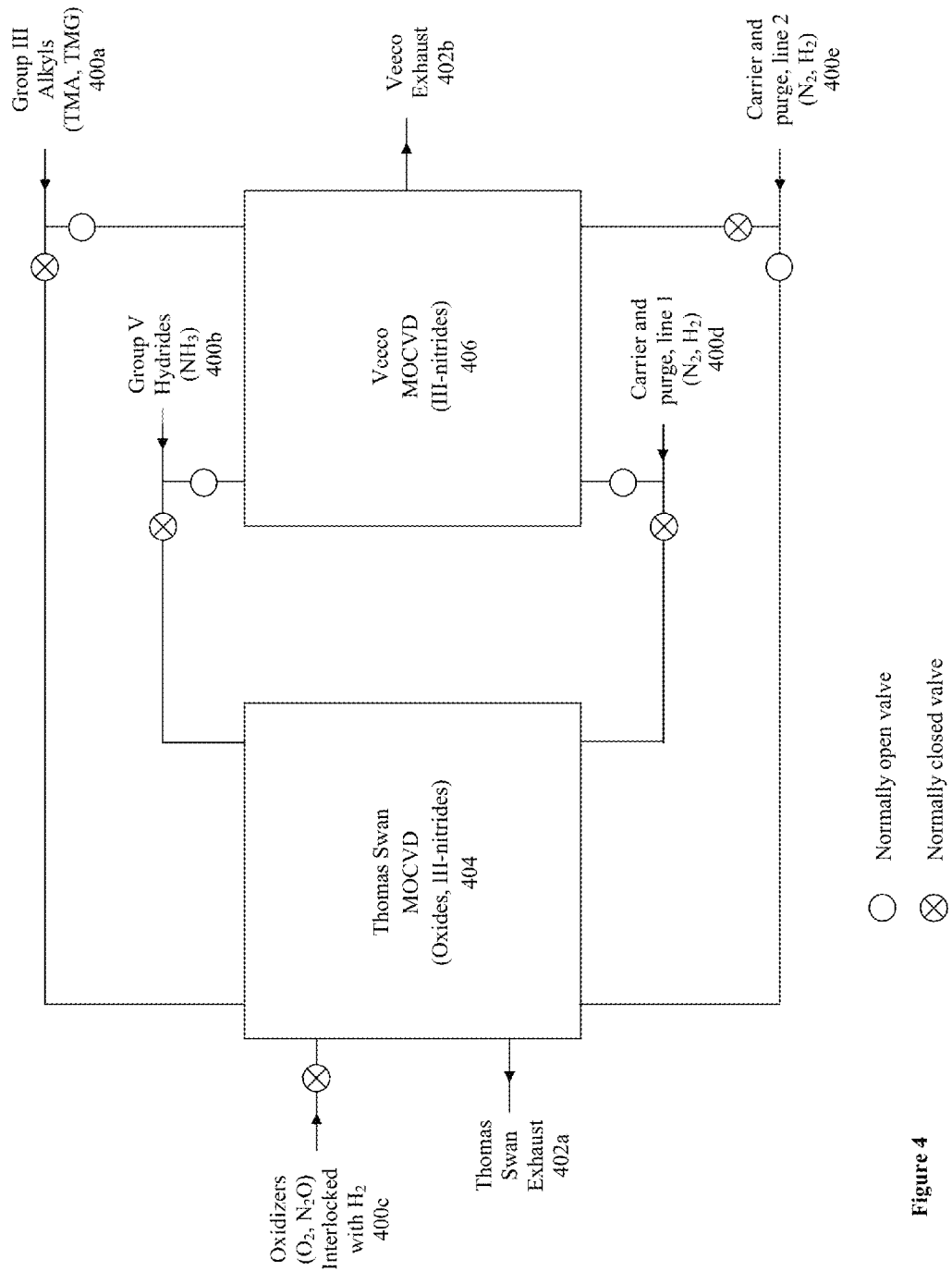

FIG. 4 presents a schematic diagram of the gas lines and exhausts of the Thomas Swan and Veeco MOCVD systems, wherein the Thomas Swan MOCVD system is used for the growth of both oxides and III-nitrides, the Veeco MOCVD system is used for the growth of III-nitrides only, and the flow directions of the precursors, carrier, and purge gases are controlled by the switching of 4 pairs of normally open and normally closed valves.

Figure 5:
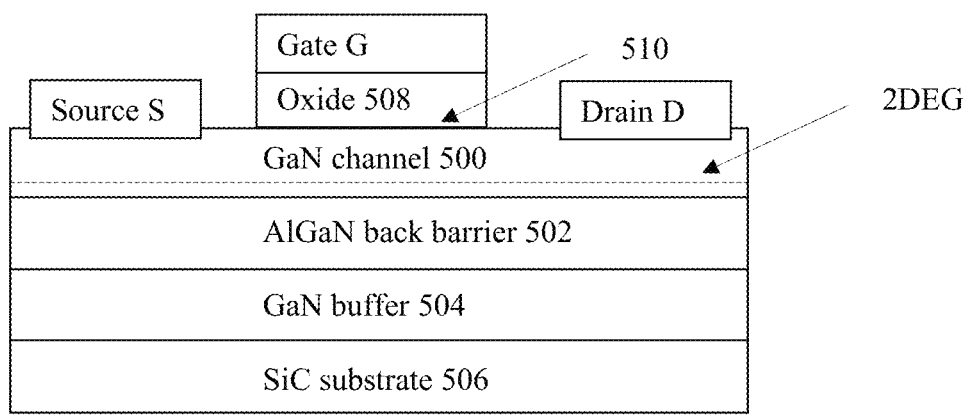

FIG. 5 illustrates a possible N-polar High Electron Mobility Transistor (HEMT) structure fabricated according to a method of the present invention.

Figure 6:
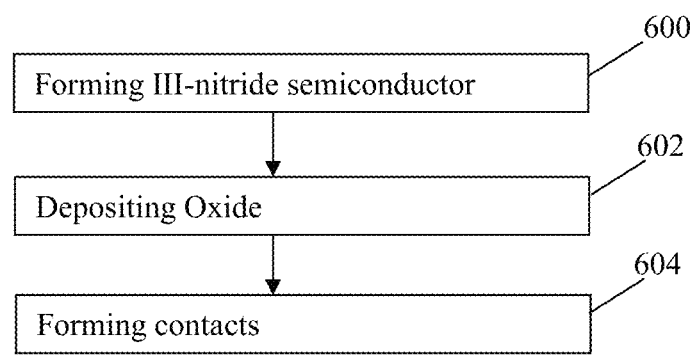

FIG. 6 is a flowchart illustrating a method of fabricating a III-nitride semiconductor device.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description

One or more embodiments of the invention describe a method to produce a high quality interfaces with tunable fixed interface charge between oxide dielectrics and N-polar III-nitride semiconductors. The oxide and N-polar III-nitride are grown sequentially by using metalorganic chemical vapor deposition (MOCVD) in the same reactor chamber without exposing the sample to air in between. The in situ grown oxide/N-polar III-nitride interfaces are free from common ambient air contaminants and are of high quality. In addition, the amount of fixed interface charge can be controlled by varying the growth temperature of oxide dielectrics.

Figure 1:
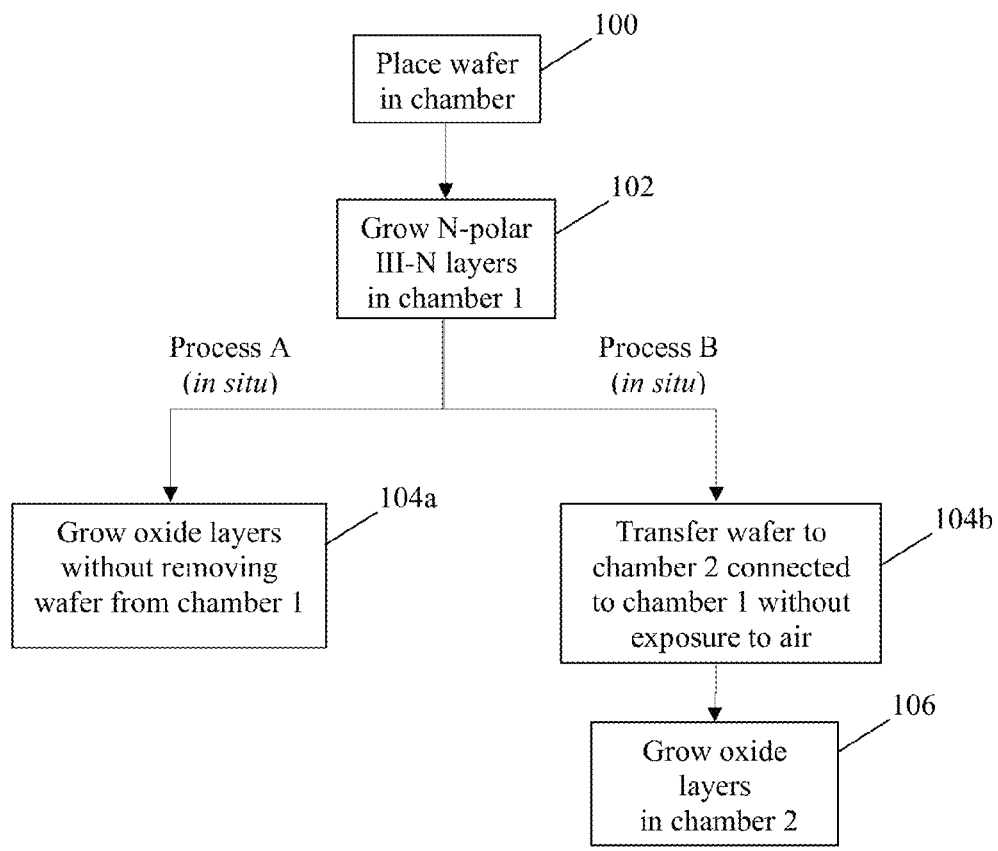
FIG. 1 is a flowchart illustrating two typical processes (A and B) of the in situ growth approach according to embodiments of the present invention.

The in situ growth approach is a key novel feature of this invention, and it enables the realization of other novel properties that are described here. The flow chart in FIG. 1 illustrates the two typical processes (A and B) of the in situ growth approach.

Block 100 represents placing a wafer in a chamber (chamber 1) and Block 102 represents growing N-polar III-N layers in the chamber 1.

In process A, the wafer is placed in chamber 1 for the growth of both N-polar III-nitride and oxide layers (i.e., the oxide layer is grown without removing the wafer from chamber 1, as represented in Block 104a).

In process B, after the wafer is placed in chamber 1 for the growth of N-polar III-nitride layers, the wafer is subsequently transferred to an interconnected chamber 2 (Block 104b) for the growth of oxide layers (as represented in Block 106). In this latter case, the wafer is not exposed to ambient air when transferred from chamber 1 to 2.

The present study is focused on process A using MOCVD for the growth of both N-polar III-nitride and oxide layers. However, it is straightforward to generalize the in situ growth approach based on process B to include the use of multiple growth techniques and/or multiple chambers. For example, the N-polar III-nitride layers can be grown by MOCVD or molecular beam epitaxy (MBE), and the oxide layers can be grown by MOCVD, MBE, atomic layer deposition (ALD), plasma enhanced chemical vapor deposition (PECVD), etc., all in specific but interconnected chambers.

Aluminum oxide ($Al_2O_3$) on N-polar GaN is used as an example to demonstrate the advantages of this invention. $Al_2O_3$ films were grown over a wide range of temperatures from 500 degrees centigrade (° C.) to 1100° C., and the present example is focused on the range from 900° C. to 1000° C. Such MOCVD growth temperatures are much higher than the typical ALD growth temperatures for $Al_2O_3$, which range from 100° C. to 500° C.

The in situ MOCVD growth of $Al_2O_3$ on N-polar GaN was described in Ref. [1]. The MOCVD reactor is a modified Thomas Swan 1×2" system having a cold-wall, rotating-disk, vertical-flow, and closed-coupled-showerhead design. The growth was carried out at a reactor pressure of 100 Torr and a thermocouple temperature of 1160° C. The initial N-polar GaN capacitance-voltage (C-V) structure was grown on a semi-insulating N-polar GaN/sapphire template using trimethylgallium (TMG) and ammonia ($NH_3$) precursors. The bottom layer was 1500 nanometer (nm) thick background Oxygen doped (O-doped) $n^+$ GaN with a carrier/electron concentration of $2\times10^{18}$ per centimeter cube ($2\times10^{18}$ $cm^{-3}$), which was grown at a rate of 5 micrometers per hour (µm/h) using 124 micromole per minute (µmol/minute) of TMG and 45 millimole per minute (mmol/minute) (1000 standard cubic centimeters per minute (sccm)) of ammonia ($NH_3$). The top layer was 600 nm thick background O-doped $n^-$ GaN with a carrier/electron concentration of $2\times10^{17}$ $cm^{-3}$, which was grown at a rate of 0.9 micrometers per hour (µm/h) using 34 µmol/minute of TMG and 180 mmol/minute (4000 sccm) of $NH_3$. The Hydrogen ($H_2$) carrier gas flow used was 7000 and 4000 sccm during the growth of $n^+$ and $n^-$ GaN, respectively.

After GaN growth, the reactor temperature was ramped down from 1160° C. to 20° C. over 30 minutes (min) under $NH_3$ and Nitrogen ($N_2$) with flow rates of 4000 sccm. When the temperature was reduced below 400° C., the $NH_3$ and $N_2$ flows were changed to 1000 and 7000 sccm, respectively. At the end of the 30-minute (min) temperature ramp, the $NH_3$ flow was stopped and the $N_2$ flow was further increased to 9000 sccm. The reactor chamber was purged with $N_2$ for 8 min. Afterwards, the reactor temperature was ramped up again to the $Al_2O_3$ growth temperature of 900° C. or 1000° C., during which $NH_3$ and $N_2$ were used and their flow rates were 2000 and 7000 sccm, respectively. When the temperature was stabilized, the $NH_3$ flow was stopped and the $N_2$ flow was increased back to 9000 sccm, and the reactor chamber was purged with $N_2$ for 12 seconds. Finally, three $Al_2O_3$ films with nominal thickness of 9, 17, and 25 nm were grown with a trimethylaluminum (TMA) flow of 1.6 µmol/min and an $O_2$ flow of either 21.4 mmol/min (480 sccm) at 900° C., or 4.5 mmol/min (100 sccm) at 1000° C.

As we have described in Ref. [2], the crystallinity of $Al_2O_3$ can be measured by using techniques such as x-ray diffraction (XRD) and transmission electron microscopy (TEM). The $Al_2O_3$ films grown at 900° C. were polycrystalline, while those grown at 1000° C. were close to single crystalline. And as we have described in Ref. [3], the concentrations of common impurity species inside $Al_2O_3$, including carbon, nitrogen, hydrogen, etc., can be measured by using techniques such as x-ray photoelectron spectroscopy (XPS) and atom probe tomography (APT). For example, the carbon concentrations of the 900° C. and 1000° C. $Al_2O_3$ films were determined to be $1\times10^{19}$ $cm^{-3}$ and $4\times10^{19}$ $cm^{-3}$, respectively [3].

Figure 2:
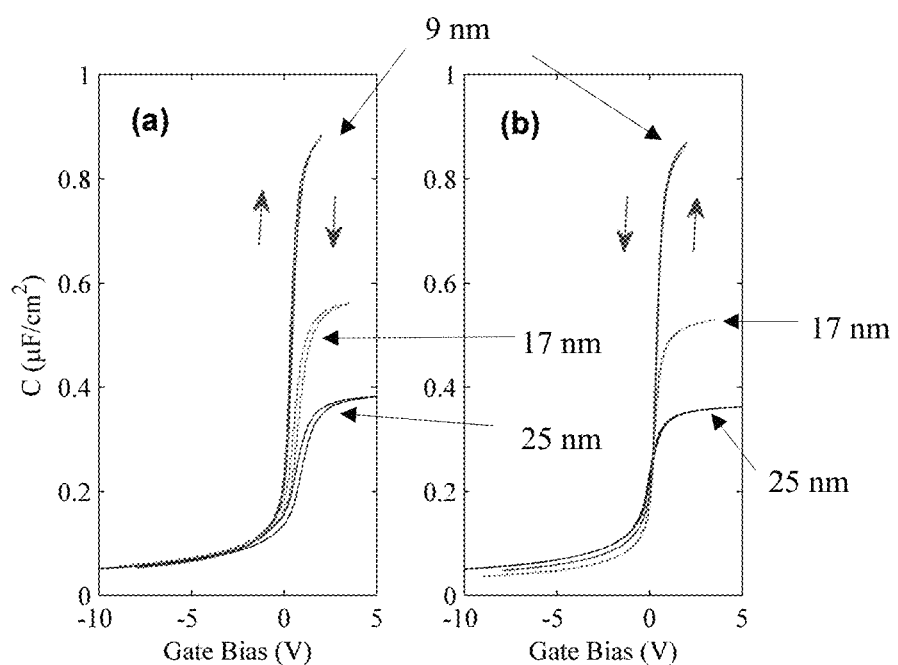
FIG. 2 shows Depletion (D) to Accumulation (A) (upward arrow) and A to D (downward arrow) sweeps measured on metal-oxide-semiconductor capacitors (MOSCAPs) with $Al_2O_3$ grown at (a) 900° C. and (b) 1000° C. with $Al_2O_3$ thicknesses of 9 nanometers (nm) (red), 17 nm (green), and 25 nm (blue), respectively, wherein the sweep directions are indicated for the 9 nm case and remain the same for the other thicknesses.

The MOSCAP fabrication, measurement, and analysis are the same as described in Refs. [1,4,5]. A MOSCAP structure with a 200 micrometer by 200 micrometer (200 μm×200 μm) square gate was fabricated. Mesa isolation was performed using a $CF_4/O_2$ based inductively coupled plasma reactive ion etch (ICP-RIE) for $Al_2O_3$, and a subsequent $BCl_3/Cl_2$ based reactive ion etch (RIE) for GaN. Ohmic contact was made on the etch-exposed n+ GaN layer. A non-alloyed 250 nm thick Aluminum/2500 nm thick gold (Au) metal stack was electron-beam evaporated as both the ohmic contact metal and the gate electrode. An Agilent 4294A Precision Impedance Analyzer was used to measure the C-V characteristics at room temperature in dark conditions. The signal amplitude and frequency were 50 millivolts (mV) and 1 Megahertz (MHz), respectively. The bias sweep rate was 200 mV per second (mV/s). MOSCAPs with $Al_2O_3$ thicknesses of 9, 17, and 25 nm were measured under different voltage bias ranges of (−8 V, 2 V), (−9 V, 3.5 V), and (−10 V, 5 V) respectively, so that the maximum oxide electric field in accumulation and the maximum GaN depletion width were kept approximately the same. A MOSCAP was initially swept from depletion D to accumulation A (D to A), and was held at accumulation for 10 min before being swept back to depletion. It was then swept from D to A and immediately back from accumulation to depletion (A to D) for a second time. FIGS. 2(a) and (b) plot the representative second pairs of D to A and A to D sweeps that were measured on MOSCAPs with $Al_2O_3$ grown at 900° C. and 1000° C. with thicknesses of 9 (red), 17 (green), and 25 nm (blue), respectively.

The fixed interface charge within a MOSCAP ($Q_f$) can be calculated from $$V_{FB} = -qQ_f d/\varepsilon_0 \varepsilon + V_{FB}^{Ideal}, \quad (1)$$

where $V_{FB}$ is the measured flat band voltage, and $V_{FB}^{Ideal}$ is the ideal flat band voltage of a charge-free MOSCAP system. Here d is the oxide film thickness, and q is the charge on an electron, $1.6 \times 10^{-19}$ C. $\varepsilon_0$ and $\varepsilon$ are the vacuum permittivity and oxide dielectric constant, respectively. When Eq. (1) is applied to both D to A and A to D sweeps, the results can be subtracted from each other to give the relationship between the relative changes of $V_{FB}$ and $Q_f$ as $$\Delta V_{FB} = -q\Delta Q_f d/\varepsilon_0 \varepsilon, \quad (2)$$

where $\Delta V_{FB}$ is the hysteresis, and $\Delta Q_f$ is the density of active interface trap states. $Q_f$ and $\Delta Q_f$ may be located at or a few nm away from the oxide/semiconductor interface.

FIG. 3 plots $V_{FB}$ (solid square) and $\Delta V_{FB}$ (open square) versus d for MOSCAPs with $Al_2O_3$ grown at (a) 900° C. and (b) 1000° C., respectively. The values of $Q_f$ and $\Delta Q_f$ are extracted by fitting the above using Eqs. (1) and (2). The result shows that $Q_f$ and $\Delta Q_f$ for MOSCAPs with $Al_2O_3$ grown at 900° C. are $-2.5 \times 10^{12}$ cm$^{-2}$ and $8.4 \times 10^{11}$ cm$^{-2}$, respectively. The corresponding quantities for MOSCAPs with $Al_2O_3$ grown at 1000° C. are $+8.9 \times 10^{10}$ cm$^{-2}$ and $6.0 \times 10^{10}$ cm$^{-2}$, respectively.

REACTOR EXAMPLES

In one embodiment, the in situ growth is carried out inside a Thomas Swan MOCVD reactor chamber, which has a vertical flow, cold wall, and closed-coupled showerhead design with a 1×2" sample handling capability. The reactor has a custom designed exhaust and venting system. The oxidizers are pure $O_2$ and $N_2O$ gases, which are injected and controlled through custom installed valves and mass flow controllers. The metalorganic sources, including trimethylgallium (TMG), triethylgallium (TEG), and trimethylaluminum (TMA), are diverted from an adjacent Veeco Pioneer P75 GaN MOCVD system through custom designed valves and controlling electronics. Also diverted are the $N_2$ and $H_2$ carrier and purge gases and the $NH_3$ gas for GaN growth. The oxidizers and $H_2$ injections are valve interlocked, and only one can be flowed at a time.

FIG. 4 shows a schematic diagram of the gas lines 400a-e and exhausts 402a, 402b of the Thomas Swan 404 and Veeco 406 MOCVD systems. The Thomas Swann MOCVD system 404 can be used to grow oxides and III-nitrides and the Veeco MOCVD system 406 can be used to grow III-nitrides. The gas lines include Group III Alkyls (TMA, TMG) gas line 400a, Group V Hydrides ($NH_3$) gas line 400b, gas line 400c for oxidizers ($O_2$, $N_2O$) interlocked with $H_2$, carrier and purge line 1 ($N_2$, $H_2$) 400d, and carrier and purge line 2 ($N_2$, $H_2$) 400e. The various gas injection times and sequences are controlled by the Veeco computer with an EpiView program. The growth temperature is controlled by a programmable Eurotherm 2404 temperature controller. The growth pressure is monitored by a MKS 122A Baratron manometer and controlled by a MKS 651C pressure controller.

The MOCVD reactor described herein can be used to perform high quality oxide growth on any materials and substrates that are as-grown in the same reactor (or loaded externally) including, but not limited to, III-nitrides with Ga- and N-polarities, III-nitrides with polar (c-plane), semipolar, and nonpolar orientations, materials with planar and non-planar surface morphologies, materials with deep trenches, and patterned surface of various kinds, etc.

In addition to the binary oxides, the MOCVD reactor described herein can also be used to grow any combination of layers in situ on top of group-III nitride layer structures, for example:

Tin oxide and Tin-doped Indium oxide (ITO);

Ternary [e.g., AlSiO and AlON] and multi-material oxides, and any suitable metal oxide can be used and any suitable combination of oxide layers in a stack can be fabricated, where Al is Aluminum, Si is Silicon, N is Nitrogen, and O is Oxygen;

Layer stacks composed of alternating layers of ternary oxides with different composition [e.g., repeating stacks comprising x nm thick $(Al_aGa_b)_2O_3$ and y nm thick $(Al_cGa_d)_2O_3$, i.e., n times (x nm $(Al_aGa_b)_2O_3$/y nm $(Al_cGa_d)_2O_3$), where n is an integer]

Combinations of MOCVD oxides and silicon nitride ($SiN_x$), for example, x nm $(Al,Ga)_2O_3$+y nm $SiN_x$ (the order of the constituents can be changed or multi-layer stacks can be fabricated), or AlSiN;

Any suitable combinations of multi-temperature dielectrics and multi-material dielectrics, and multi-temperature multi-material dielectrics;

In situ dielectric can be follow by growth of other ex situ dielectrics, for example, by atomic layer deposition (ALD), chemical vapor deposition (CVD), etc;

Oxide layers that are of semiconducting nature can be used to fabricate field effect transistors.

The MOCVD reactor described herein can be used to grow oxides and dielectrics with any crystallinity, including amorphous, nanocrystalline (amorphous matrix with scattered crystalline features on the order of nanometers), polycrystalline, and single crystalline oxides and dielectrics, etc. The crystallinity of oxides and dielectrics is mainly determined by the MOCVD growth temperature, but it can also be influenced by factors such as substrate, growth rate, film thickness, thermal anneal, and dopants [e.g., Si], etc.

A high quality oxide/semiconductor interface can also be obtained from this single chamber growth approach by introducing etching reactions to an as-grown or externally transferred semiconductor prior to oxide growth. For example, the $O_2$ source in the MOCVD reactor can be used at elevated temperature and low pressures to introduce active oxidation reactions for etching [6]. Other possible etching sources include $N_2O$, $H_2$, $N_2$, $NH_3$, HCl, and Cl-containing gases, or other halogen containing compounds, and any material that has a corrosive nature in its vapor phase. Etching can remove a top layer that is either contaminated or is of sacrificial nature, and therefore generate a better starting surface for subsequent growth.

Etching can also be used to introduce certain patterns on selective layers at any stage of growth, which greatly opens up the design space of many devices. For example, a top oxide layer can be etched to induce faceting, which helps to improve the light extraction of light emitting diodes and the light absorption of solar cells. A semiconductor layer can also be etched to alter its strain behavior. An etched layer can also better accommodate the growth of another layer with a different lattice constant, since the lattice and charge discontinuities are reduced.

The qualities of the oxides and oxide/semiconductor interfaces can be further enhanced by using in situ thermal anneals after dielectric(s) growth within the same reactor chamber, as we have described in Ref. [7]. For example, the amount of certain impurities can be reduced, and certain types of defects can become passivated [8]. Also, the density of the oxide films can be increased. Possible ambient gases that can be used during annealing include $N_2$, $H_2$, $O_2$, $N_2O$, $NH_3$, $N_2/H_2$ forming gas, etc., or any suitable combinations that involve two or more gas species.

In one embodiment, the present invention describes the use of a single chamber for MOCVD in situ growth of oxide dielectric(s) on III-nitride semiconductors. However, as discussed above, alternative embodiments may include growing group III-nitride(s) and oxide(s) in a multi-chamber MOCVD reactor with designated separate chambers for nitride and oxide growth. Here the growth is also "in situ" in nature, since in such an embodiment, the sample is transferred from the nitride chamber to the oxide chamber in such a way that it is never exposed to air, thereby preventing any contamination of its surface during the transfer process. The multi-chamber approach would also eliminate any problems related to the dissimilarity of the nitride and oxide growth processes.

MOCVD growth can be controlled by computer, and devices can be processed, measured, and analyzed.

Device Embodiments

The oxide/N-polar III-nitride interfaces that are described in this invention are of high quality with very low defect densities. By taking advantage of such a high quality interface, a device will have more efficient gate modulation, less gate charge trapping, less threshold voltage drift, and lower gate leakage current. Moreover, a high quality oxide/N-polar III-nitride interface also improves the passivation of the active region of the device, resulting in less Radio Frequency-Direct Current (RF-DC) dispersion and better high frequency performance. In addition, the tunable interface charge at the oxide/N-polar III-nitride interfaces can greatly expand the design space of III-nitride devices.

$Al_2O_3$/InAlGaN based MOSHEMT devices (e.g., N-polar $Al_2O_3$/InAlGaN devices) could be fabricated using the one or more embodiments of the present invention, for example. In another example, AlGaSiO/InAlGaN based in situ devices could also be grown and fabricated and the interface state densities and output performances could be measured.

FIG. 5 illustrates a possible N-polar High Electron Mobility Transistor (HEMT) structure fabricated according to an embodiment of the present invention. The process consists of growing a N-polar III-nitride semiconductor active region, comprising a GaN channel layer 500 and an AlGaN back barrier layer 502, on a GaN buffer layer 504 on a SiC substrate 506; sequentially growing an oxide dielectric or passivation layer 508 and the GaN channel layer 500 to form an oxide/GaN interface 510 without exposure to air in between growth of the oxide 508 and growth of the GaN channel layer 500; forming drain D and source S ohmic contacts to the active region; and depositing a metal gate G on the oxide dielectric and between the source and drain. Charge trapping at the interface 410 under device operation may be no more than $10^{10}$ to $10^{11}$ cm$^{-2}$, for example. The AlGaN back barrier layer 502 confines a two dimensional electron gas (2DEG) in the GaN channel layer 500. It is straightforward to generalize the above process to the use of different III-nitride channel/barrier/buffer/cap layers and similar structures with Ga-polarities.

Process Steps

FIG. 6 illustrates a method of fabricating a III-nitride semiconductor device, comprising the following steps.

Block 600 represents forming (e.g., growing) a III-nitride semiconductor layer (e.g., including an active region of a device). The III-nitride semiconductor layer can be an N-polar III-nitride layer.

Block 602 represents depositing (e.g., growing) an oxide (e.g., Aluminum Oxide ($Al_2O_3$)) on the III-nitride semiconductor layer. The III-nitride semiconductor layer and the oxide can be grown sequentially to form an oxide/III-nitride interface without exposure to air in between growth of the oxide and growth of the III-nitride semiconductor layer. The oxide can be deposited on an N-face of the III-nitride semiconductor layer. The growing of the oxide and the III-nitride semiconductor layer can be performed in situ in a growth reactor. The oxide and the III-nitride semiconductor can be grown in separate interconnected chambers in a growth reactor.

The oxide and III-nitride semiconductor layer can be grown at a temperature above 500° C. or at a temperature above 900° C., e.g., at a temperature in a range of 900-1100° C.

The method can include selecting the growth temperature in order to tune the fixed interface charge at the oxide/N-polar III-nitride interface.

A density of trap states at the oxide/III-nitride interface (e.g., under device operation) can be less than $10^{11}$ cm$^{-2}$ (or no more than $10^{10}$ to $10^{11}$ cm$^{-2}$). Fixed interface charge at the oxide/III-nitride interface can be negative, positive, or negligibly positive. The fixed interface charge at the oxide/III-nitride interface can be greater than $-2.5 \times 10^{12}$ cm$^{-2}$ (e.g., in a range of $-2.5 \times 10^{12}$ cm$^{-2}$ to $+8.9 \times 10^{10}$ cm$^{-2}$).

Block 504 represents forming contacts (e.g., source, drain, gate) to form a device, such as a MOSHEMT. For example, the oxide (e.g., oxide or passivation layer) can be between a gate of the device and the active region.

The device can comprise (referring to the example of FIG. 5) an N-polar III-nitride semiconductor active region (e.g., comprising an N-polar AlGaN barrier layer 502 and an N-polar GaN channel layer 500); an oxide layer 508 forming an interface 510 with the active region (e.g., forming an interface 510 with the N-polar GaN channel layer 500); drain D and source S contacts electrically coupled to the active region; and a gate G deposited on the oxide layer 508 between the source S and drain D contacts; wherein a density of trap states at the interface 510 is less than $10^{11}$ cm$^{-2}$.

The interface can achieve at least one of the following properties: suppressed gate leakage current, improved device stability under increasing frequency operating conditions, more efficient gate modulation, less gate charge trapping, less threshold voltage drift, and improved passivation of the active region of the device resulting in less RF-DC dispersion and better high frequency performance.

Blocks 600-602 can be performed in a reactor. One or more embodiments of the invention further disclose an apparatus for growth of oxide(s) and oxide/semiconductors, comprising: a reactor for growing oxide(s) and oxide/semiconductors via MOCVD, wherein both top oxide layers and underlying semiconductor layers are grown in a single chamber (e.g. same chamber) of the reactor sequentially without breaking vacuum.

Advantages and Improvements

Currently the performance of commercial III-nitride MOSHEMTs is largely limited by the availability of proper dielectrics and associated deposition techniques to form a high quality dielectric/III-nitride interface, which is essential for suppressing gate leakage current and improving device stability under high frequency operating conditions.

The in situ MOCVD deposition approach that is used in one or more embodiments of the present invention to form the high quality interfaces can be easily integrated into the production of any modern group III-nitride electronic device that utilizes the MOCVD technology. The total growth time for the device structures can be reduced, and the extensive chemical pretreatment steps before dielectric depositions are no longer needed. Thus, the growth approach of embodiments of present invention can be integrated into the production of modern group III-nitride (Al,Ga,In)N electronic devices to enhance yield.

The output performance of devices grown using the present invention can be greatly enhanced due to the existence of high quality oxide/semiconductor interfaces. The resulting devices will have more efficient gate modulation, less gate charge trapping, less threshold voltage drift, and less gate leakage currents. In addition, the approach of the present invention improves the passivation of the active region of the devices, resulting in less RF-DC dispersion and better high frequency performance.

In one embodiment, the various defects that are located at or near an $Al_2O_3$/N-polar GaN interface are measured on a metal-oxide-semiconductor capacitor (MOSCAP) structure. Some of the key results are summarized below.

(1) For in situ MOCVD grown $Al_2O_3$/N-polar GaN interfaces with $Al_2O_3$ grown between 900° C. and 1000° C., the density of fast trap states and the amount of charge trapping during device operation are both on the order of $10^{10}$ to $10^{11}$ $cm^{-2}$. Such numbers are one to two orders of magnitude smaller than those of typical $Al_2O_3$/N-polar GaN interfaces with $Al_2O_3$ grown by ex situ techniques, including atomic layer deposition (ALD) and plasma enhanced chemical vapor deposition (PECVD) techniques, among others.

(2) Surprisingly, the in situ MOCVD grown $Al_2O_3$/N-polar GaN interface with $Al_2O_3$ grown at 900° C. has a net negative fixed interface charge of $-2.5 \times 10^{12}$ $cm^{-2}$. This is unexpected and totally different from the ex situ ALD grown $Al_2O_3$/N-polar GaN interface, which has a net positive fixed interface charge that ranges from $+0.9 \times 10^{12}$ to $+9.2 \times 10^{12}$ $cm^{-2}$ [8].

(3) When the $Al_2O_3$ growth temperature changes, the amount of fixed interface charge also becomes different. Most notably, the in situ MOCVD grown $Al_2O_3$/N-polar GaN interface with $Al_2O_3$ grown at 1000° C. has a net positive, but negligibly small, interface fixed charge of $+8.9 \times 10^{10}$ $cm^{-2}$.

Possible Modifications

One or more embodiments of the present invention can be used to fabricate III-nitride semiconductor optoelectronic or electronic devices (e.g., semipolar, polar, non-polar III-nitride devices).

Thus, in addition to electronic devices, this invention can be extended into the production of group III-nitride optoelectronics, including, but not limited to, light emitting diodes, laser diodes, photodetectors, and solar cells, of any wavelength/frequency operation range. The in situ grown dielectric layers can improve the morphology stability of group III-nitride surfaces and prevent unintentional cracking during temperature ramps. They can control the strain of the underlying group III-nitride layers to produce desired output performances. They can also potentially improve light extraction behaviors and enhance external quantum efficiencies.

Nomenclature

GaN and its ternary and quaternary compounds incorporating aluminum and indium (AlGaN, InGaN, AlInGaN) are commonly referred to using the terms (Al,Ga,In)N, III-nitride, III-N, Group III-nitride, nitride, $Al_{(1-x-y)}In_yGa_xN$ where $0<x<1$ and $0<y<1$, or AlInGaN, as used herein. All these terms are intended to be equivalent and broadly construed to include respective nitrides of the single species, Al, Ga, and In, as well as binary, ternary and quaternary compositions of such Group III metal species. Accordingly, these terms comprehend the compounds AlN, GaN, and InN, as well as the ternary compounds AlGaN, GaInN, and AlInN, and the quaternary compound AlGaInN, as species included in such nomenclature. When two or more of the (Ga, Al, In) component species are present, all possible compositions, including stoichiometric proportions as well as "off-stoichiometric" proportions (with respect to the relative mole fractions present of each of the (Ga, Al, In) component species that are present in the composition), can be employed within the broad scope of the invention. Accordingly, it will be appreciated that the discussion of the invention hereinafter in primary reference to GaN materials is applicable to the formation of various other (Al, Ga, In)N material species. Further, (Al,Ga,In)N materials within the scope of the invention may further include minor quantities of dopants and/or other impurity or inclusional materials. Boron (B) may also be included.

One approach to eliminating the spontaneous and piezoelectric polarization effects in GaN or III-nitride based optoelectronic devices is to grow the III-nitride devices on nonpolar planes of the crystal. Such planes contain equal numbers of Ga (or group III atoms) and N atoms and are charge-neutral. Furthermore, subsequent nonpolar layers are equivalent to one another so the bulk crystal will not be polarized along the growth direction. Two such families of symmetry-equivalent nonpolar planes in GaN are the {11-20} family, known collectively as a-planes, and the {1-100} family, known collectively as m-planes. Thus, nonpolar III-nitride is grown along a direction perpendicular to the (0001) c-axis of the III-nitride crystal.

Another approach to reducing polarization effects in (Ga, Al,In,B)N devices is to grow the devices on semi-polar planes of the crystal. The term "semi-polar plane" (also referred to as "semipolar plane") can be used to refer to any plane that cannot be classified as c-plane, a-plane, or m-plane. In crystallographic terms, a semi-polar plane may include any plane that has at least two nonzero h, i, or k Miller indices and a nonzero l Miller index.

Some commonly observed examples of semi-polar planes include the (11-22), (10-11), and (10-13) planes. Other examples of semi-polar planes in the wurtzite crystal structure include, but are not limited to, (10-12), (20-21), and (10-14). The nitride crystal's polarization vector lies neither within such planes or normal to such planes, but rather lies at some angle inclined relative to the plane's surface normal. For example, the (10-11) and (10-13) planes are at 62.98° and 32.06° to the c-plane, respectively.

The Gallium or Ga face of GaN is the c+ or (0001) plane, and the Nitrogen or N-face of GaN or a III-nitride layer is the c− or (000-1) plane.

The term dielectrics comprehends oxide dielectrics and other non-oxide dielectrics, for example, nitride dielectrics such as $Si_3N_4$.

REFERENCES

The following references are incorporated by reference herein.

[1] "In situ metalorganic chemical vapor deposition of $Al_2O_3$ on N-face GaN and evidence of polarity induced fixed charge", X. Liu, J. Kim, D. J. Suntrup, S. Wienecke, M. Tahhan, R. Yeluri, S. H. Chan, J. Lu, H. Li, S. Keller, and U. K. Mishra, Appl. Phys. Lett. 104, 263511 (2014).

[2] "Metalorganic chemical vapor deposition of $Al_2O_3$ using trimethylaluminum and $O_2$ precursors: Growth mechanism and crystallinity", X. Liu, S. H. Chan, F. Wu, Y. Li, S. Keller, J. S. Speck, and U. K. Mishra, J. Cryst. Growth 408, 78 (2014).

[3] "Atom probe tomography studies of $Al_2O_3$ gate dielectrics on GaN", B. Mazumder, X. Liu, R. Yeluri, F. Wu, U. K. Mishra, and J. S. Speck, J. Appl. Phys. 116, 134101 (2014).

[4] "Fixed charge and trap states of in situ $Al_2O_3$ on Ga-face GaN metal-oxide-semiconductor capacitors grown by metalorganic chemical vapor deposition", X. Liu, J. Kim, R. Yeluri, S. Lal, H. Li, J. Lu, S. Keller, B. Mazumder, J. S. Speck, and U. K. Mishra, J. Appl. Phys. 114, 164507 (2013).

[5] "In-situ metalorganic chemical vapor deposition and capacitance-voltage characterizations of $Al_2O_3$ on Ga-face GaN metal-oxide-semiconductor capacitors", X. Liu, R. Yeluri, J. Kim, S. Lal, A. Raman, C. Lund, S. Wienecke, J. Lu, M. Laurent, S. Keller, and U. K. Mishra, Appl. Phys. Lett. 103, 053509 (2013).

[6] "Reaction of oxygen with Si(111) and (100): Critical conditions for the growth of $SiO_2$", F. W. Smith and G. Ghidini, J. Electrochem. Soc. 129, 1300 (1982).

[7] "Dielectric stress tests and capacitance-voltage analysis to evaluate the effect of post deposition annealing on $Al_2O_3$ films deposited on GaN", R. Yeluri, X. Liu, M. Guidry, O. S. Koksaldi, S. Lal, J. Kim, J. Lu, S. Keller, and U. K. Mishra, Appl. Phys. Lett. 105, 222905 (2014).

[8] "Interface charge engineering at atomic layer deposited dielectric/III-nitride interfaces", T. H. Hung, S. Krishnamoorthy, M. Esposto, D. N. Nath, P. S. Park, and S. Rajan, Appl. Phys. Lett. 102, 072105 (2013).

[9] "Comparison of low-temperature GaN, $SiO_2$, and $SiN_x$ as gate insulators on AlGaN/GaN heterostructure field-effect transistors", C. J. Kao, M. C. Chen, C. J. Tun, G. C. Chi, J. K. Sheu, W. C. Lai, M. L. Lee, F. Ren, S. J. Pearton, J. Appl. Phys. 98, 064506 (2005).

[10] "Improvement of AlGaN/GaN high electron mobility transistor structure by in situ deposition of a $Si_3N_4$ surface layer", J. Derluyn, S. Boeykens, K. Cheng, R. Vandersmissen, J. Das, W. Ruythooren, S. Degroote, M. R. Leys, M. Germain, G. Borghs, J. Appl. Phys. 98, 054501 (2005).

[11] "The effect of interface processing on the distribution of interfacial defect states and the C-V characteristics of III-V metal-oxide-semiconductor field effect transistors", C.-W. Cheng, G. Apostolopoulos, and E. A. Fitzgerald, J. Appl. Phys. 109, 023714 (2011).

[12] "In situ SiN passivation of AlGaN/GaN HEMTs by molecular bema epitaxy", B. Heying, I. P. Smorchkova, R. Coffie, V. Gambin, Y. C. Chen, W. Sutton, T. Lam, M. S. Kahr, K. S. Sikorshi, M. Wojtowicz, Electron Lett. 43, 779 (2007).

[13] "Effective reduction of interfacial traps in $Al_2O_3$/GaAs (001) gate stacks using surface engineering and thermal annealing", Y. C. Chang, C. Merckling, J. Penaud, C. Y. Lu, W. E. Wang, J. Dekoster, M. Meuris, M. Caymax, M. Heyns, J. Kwo, M. Hong, Appl. Phys. Lett. 97, 112901 (2010).

[14] US Patent Publication No. 2008/0199993A1, entitled "Protective Layer in Device Fabrication," by B. Heying et al., published Aug. 21, 2008.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of fabricating a III-nitride semiconductor device, comprising: growing a III-nitride semiconductor layer and an oxide sequentially to form an oxide/III-nitride interface, without exposure to air in between growth of the oxide and growth of the III-nitride semiconductor layer, wherein fixed interface charge at the oxide/III-nitride interface is greater than $-2.5 \times 10^{12}$ cm$^{-2}$.

2. The method of claim 1, wherein the growing of the oxide and the III-nitride semiconductor layer is performed in situ in a growth reactor.

3. The method of claim 1, wherein the oxide and III-nitride semiconductor layer are grown at a temperature above 500° C.

4. The method of claim 1, wherein the oxide and III-nitride semiconductor layer are grown at a temperature above 900° C.

5. The method of claim 1, wherein the oxide and III-nitride semiconductor layer are grown at a temperature in a range of 900° C.-1100° C.

6. The method of claim 1, wherein fixed interface charge at the oxide/III-nitride interface is positive.

7. The method of claim 1, wherein fixed interface charge at the oxide/III-nitride interface is in a range of $-2.5 \times 10^{12}$ cm$^{-2}$ to $+8.9 \times 10^{10}$ cm$^{-2}$.

8. A method of fabricating a III-nitride semiconductor device, comprising:
growing a III-nitride semiconductor layer and an oxide sequentially to form an oxide/III-nitride interface, without exposure to air in between growth of the oxide and growth of the III-nitride semiconductor layer, wherein the oxide and the III-nitride semiconductor layer are grown in separate interconnected chambers in a growth reactor.

9. A method of fabricating a III-nitride semiconductor device, comprising:
growing a III-nitride semiconductor layer and an oxide sequentially to form an oxide/III-nitride interface, without exposure to air in between growth of the oxide and growth of the III-nitride semiconductor layer, wherein the III-nitride semiconductor layer is an N-polar III-nitride layer.

10. The method of claim 9, wherein the oxide is deposited on an N-face of the III-nitride semiconductor layer.

11. A method of fabricating a III-nitride semiconductor device, comprising:
    growing a III-nitride semiconductor layer and an oxide sequentially to form an oxide/III-nitride interface, without exposure to air in between growth of the oxide and growth of the III-nitride semiconductor layer, wherein the device is a metal oxide semiconductor high electron mobility transistor (MOSHEMT).

12. The method of claim 11, wherein the III-nitride semiconductor layer includes an active region of the device and the oxide is between a gate of the device and the active region.

13. A method of fabricating a III-nitride semiconductor device, comprising:
    growing a III-nitride semiconductor layer and an oxide sequentially to form an oxide/III-nitride interface, without exposure to air in between growth of the oxide and growth of the III-nitride semiconductor layer, wherein a density of trap states at the oxide/III-nitride interface is less than $10^{11}$ cm$^2$.

14. A method of fabricating a III-nitride semiconductor device, comprising:
    growing a III-nitride semiconductor layer and an oxide sequentially to form an oxide/III-nitride interface, without exposure to air in between growth of the oxide and growth of the III-nitride semiconductor layer, wherein fixed interface charge at the oxide/III-nitride interface is negative.

15. A device, comprising:
    an N-polar III-nitride semiconductor active region;
    an oxide layer forming an interface with the active region;
    drain and source contacts electrically coupled to the active region; and
    a gate deposited on the oxide layer between the source and drain contacts;
    wherein a density of trap states at the interface is less than $10^{11}$ cm$^2$.

16. The device of claim 15, wherein:
    the active region comprises an N-polar AlGaN barrier layer and an N-polar GaN channel layer; and
    the oxide layer forms the interface with the N-polar GaN channel layer.

17. The device of claim 15, wherein the oxide layer comprises $Al_2O_3$.

* * * * *